Nov. 11, 1969 G. G. EHLENBERGER 3,477,886

CONTROLLED DIFFUSIONS IN SEMICONDUCTIVE MATERIALS

Filed Feb. 27, 1967

INVENTOR.
Gary G. Ehlenberger

BY

Mueller, Aichele & Rauner

ATTY'S.

United States Patent Office 3,477,886
Patented Nov. 11, 1969

3,477,886
CONTROLLED DIFFUSIONS IN SEMI-CONDUCTIVE MATERIALS

Gary G. Ehlenberger, Phoenix, Ariz., assignor to Motorola, Inc., Franklin Park, Ill., a corporation of Illinois Continuation-in-part of application Ser. No. 416,229, Dec. 7, 1964. This application Feb. 27, 1967, Ser. No. 618,716
Int. Cl. H01l 7/44
U.S. Cl. 148—187 24 Claims

ABSTRACT OF THE DISCLOSURE

A semiconductor region is formed by diffusing indium or gallium into a silicon substrate having a coating of silicon dioxide wherein the diffusants move laterally through the silicon dioxide layer when such layer has a thickness of at least about 500 A. for forming a relatively wide region in the substrate. Multiple diffusions forming greatly varying region widths are performed through a single aperture. A silicon dioxide layer having a thickness of 100 angstrom units does not facilitate lateral diffusions. The thicker the oxide layer, the greater the lateral diffusion. A metal or silicon nitride mask is used for masking the diffusions.

RELATED CASE

This application is a continuation-in-part application of Gary E. Ehlenberger application Ser. No. 416,229, filed Dec. 7, 1964, now abandoned, and entitled "Electronic Process," now abandoned.

BACKGROUND OF THE INVENTION

The present invention relates generally to methods for diffusing junctions into solid state planar semiconductor substrates, and it relates more particularly to an improved masking process for use in such diffusion methods and to the lateral diffusion of P type impurities.

In the construction of planar diffused junction transistors, for example, it is known to provide a semiconductor wafer of P type conductivity characteristics, and to form an oxide mask on a surface of the semiconductor wafer. The wafer may, for example, be composed of germanium or silicon; and the mask may be composed, for example, of silicon dioxide.

Then, in accordance with usual prior art practice, an opening is formed in the oxide mask to expose a portion of the surface of the semiconductor wafer. A selected N type dopant may then be diffused into the wafer through the opening in the mask and through the exposed portion of the surface of the wafer. The silicon dioxide acts as a mask for the dopant, and a PN junction is formed in the wafer as a result of the diffusion process, the junction terminating at the aforesaid surface of the wafer and under the oxide mask to be passivated thereby.

However, problems arise when it is attempted to use silicon dioxide or other vapor plated glass materials as a mask to limit the area in which diffusion takes place. The vapor plated glass materials are not resistant to the diffusion of certain dopant materials and thus diffusion of these particular materials will take place through the mask. For example, impurities such as indium or gallium are not masked by silicon dioxide, a common masking material. This is particularly true at the high temperatures used for diffusion into a semiconductor wafer such as silicon.

In fabricating small area semiconductor devices one of the problems encountered is making a suitable electrical connection to an intermediate semiconductor region, such as a base region of a transistor. Previously, two etch cutting steps for forming two apertures in the passivating coating or layer were required for making a small area device having a base region of sufficient lateral extent to make an electrical connection thereto in a facile manner; one cutting step to form a large aperture in the passivating coating for a base diffusion and the second step for cutting a smaller aperture in the passivating coating to diffuse an emitter region. These steps require etching to the surface of a semiconductor twice plus creating registration problems as between the emitter region and the base region which can alter the electrical characteristics of the resultant device and create additional problems of making electrical connections to the base regions. Therefore, in fabricating semiconductor devices it would be advantageous if a plurality of semiconductor regions of varying lateral extent could be formed through a single aperture in the various coatings on semiconductor wafers.

In fabricating high frequency devices, it is desirable that the semiconductor region be quite shallow. In fabricating such devices etching the surface of the semiconductor wafers immediately adjacent such shallow regions can adversely affect the characteristics thereof. Such shallow regions extend under the passivating layer only a short distance. In etching, a portion of such layer is always removed which in shallow regions may expose the junction such that it is not passivated as required.

SUMMARY OF THE INVENTION

An object of the present invention is to provide improved masking process by which P type impurities may be selectively diffused into a semiconductor wafer to provide a planar passivated diffused junction unit.

Another object of the invention is to provide such an improved masking process whereby there is no tendency for the occurrence of any alloying action between the impurities and the substrate during the diffusion process.

It is another object of the present invention to provide a diffusion process by which impurity dopants are selectively diffused into semiconductor wafer with such diffusion being controlled to determine the lateral diffusion of such impurities under a diffusion mask.

A still further object is to provide a process of fabrication of small areas of semiconductor devices in which registration of adjacent semiconductor regions is maintained in a facile manner.

Another object is to provide an improved diffusion process whereby the lateral diffusion is much greater in extent than the depth of diffusion into the semiconductor wafer such that the lateral extent facilitates making an electrical connection to such laterally diffused region.

In carrying out the process of the invention, for example, in one of its embodiments, an oxide layer is first deposited on a surface of a semiconductor wafer. The wafer, by way of example, may be composed of silicon or germanium, and it may have N-type conductivity characteristics. The oxide layer does not perform any masking function; when a metal mask is used it serves to protect the surface of the semiconductor wafer from damage. Such damage could occur due to alloying of a subsequent metallic layer which, as will be described, actually performs a masking function. When the oxide layer has a thickness of 500 angstrom units or greater the impurities gallium and indium diffuse more rapidly through the oxide layer than through the silicon. In diffusing through the oxide layer they also will diffuse into the silicon or germanium semiconductor material from the layer forming a diffused region of great lateral extent and substantially small thickness. Several forms of glasses including vapor plated glasses are permeable to such diffusants, although they may not provide equivalent results as pure silicon dioxide. A gallium silicate glass deposited over the oxide or glass layer, for example to a thickness of 300 A., may be used as a diffusion source.

The selected masking layer may be either metallic, silicon nitride, or any other masking material impervious to gallium or indium and is preferably formed over the oxide lateral diffusing layer.

Silicon nitride, a material suitable for passivating semiconductor surfaces, forms a good mask for indium and gallium diffusions. In deep diffusions, characterized by high temperatures (1200° C.) and extended process times (several hours) it is desirable that the silicon nitride be protected from the oxygen atmosphere of an indium or gallium diffusion. A layer of silicon dioxide is suitable for such protection. In shallow diffusions or diffusions in an inert (nitrogen, for example) or reducing environment such protective layer is not required. The metal forming a metallic masking layer is selected to be compatible as a diffusion mask for the particular P type impurities to be diffused into the wafer; for example, indium or gallium. For such purposes the metallic layer may be nickel or titanium. For protecting the metal mask at high diffusion temperatures, a second oxide or other type layer of material including silicon may be formed over the metallic layer. Such additional protective oxide or silicon layer inhibits any tendency of the metallic masking layer to form a liquid eutectic at the diffusion temperatures and run off the surface of the semiconductor wafer or for the silicon nitride to react with the oxidizing atmosphere at high temperatures normally used in such diffusions.

Materials useable as a mask are those which form compounds with indium or gallium for preventing penetration of the material thereby. Also, the melting temperature should be higher than the diffusion temperatures. Such materials, in addition to the ones above mentioned, include silicon carbide, boron nitride and platinum, even though equivalent results may not be obtained by their usage.

THE DRAWING

DESCRIPTION OF THE ILLUSTRATIVE EMBODIMENTS

Figure 1:
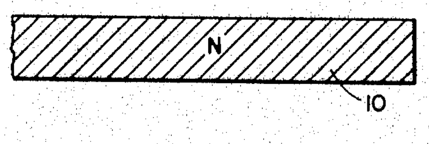
FIG. 1 shows an enlarged cross sectional view of a semiconductor wafer.

In carrying out the process of the invention, a semiconductor wafer 10 (FIG. 1) is provided as a substrate. As mentioned above, this semiconductor wafer may be composed of germanium or silicon. Also, the semiconductor wafer 10 may have N type conductivity characteristics, it being desired in the particular embodiment to be described to diffuse a P type region into the semiconductor wafer.

As mentioned above, prior to the present invention, no mask was available for the selective diffusion of P type impurities, such as indium or gallium, into an N type wafer, such as the wafer 10. The usual prior art masking films either exhibited no capability of masking the particular impurities, or else exhibited a tendency to alloy into the wafer itself.

Because of the above-mentioned problems, the formation of PN junctions in N type substrates usually required mesa etching techniques in the prior art. However, as is well known, such techniques are subject to certain disadvantages, particularly because of the difficulty of passivating the resulting junctions formed by such techniques.

Figure 2:
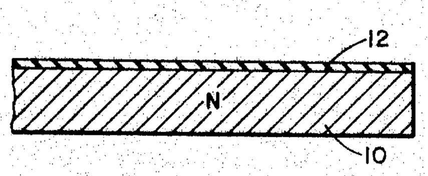
FIG. 2 shows a semiconductor wafer with a layer of silicon dioxide applied.

In carrying out the process of the present invention, in the illustrated embodiment of FIG. 2, a silicon dioxide layer 12, for example, is deposited over the surface of the wafer 10. This oxide layer 12 may be deposited, for example, by vapor plating, or in an epitaxial furnace. The film thickness is not critical, and it may be of the order of 1,000–2,000 A.

For example, in FIG. 2 the silicon dioxide film 12 may be formed by heating the wafer 10 in an appropriate furnace to an elevated temperature of, for example, 1150° C., and to expose it to water vapor for two hours, followed by two hours of oxygen. The water vapor and oxygen will react with the silicon, for example, when a silicon wafer 10 is used, so as to form a silicon dioxide ($SiO_2$) film 12. Other vapor plated glass materials, as for example aluminum borosilicate or aluminum silicate may be used in place of silicon dioxide.

As mentioned, the silicon dioxide film 12 does not provide any masking function. However, when used a metallic mask serves to protect the surface of the semiconductor wafer 10 from damage which could otherwise occur by alloying metal masking layer 14, and which is formed in accordance with FIG. 3 of the process of the invention. Therefore, the function of the silicon dioxide layer 12 is to protect the surface of the semiconductor wafer 10.

Figure 3:
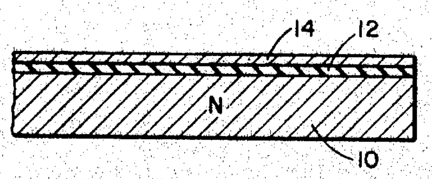
FIG. 3 shows a semiconductor wafer with a metallic layer applied over the layer of silicon dioxide.

The metallic layer 14 of FIG. 3 may be deposited over the oxide layer 12 by evaporating or vapor plating, for example, a selected metal over the layer 12. As mentioned, this metal must be compatible as a diffusion mask with the particular impurities to be diffused into the substrate 10. For example, the metal forming the metallic layer 14 may be nickel or titanium, when P type impurities, such as indium or gallium, are to be diffused into the semiconductor substrate wafer 10.

Figure 4:
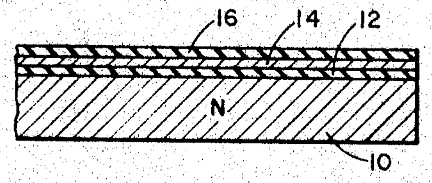
FIG. 4 shows a semiconductor wafer with a layer of silicon dioxide applied over the metallic layer which has been applied over the silicon dioxide layer.

In order to protect the metal mask 14, a further silicon dioxide layer 16 (FIG. 4) is formed over the metallic layer 14. This latter layer serves to protect the metal mask 14, and to substantially eliminate any tendency of that layer to form a liquid eutectic with the diffusants at the diffusion temperatures, and thereby lose its masking ability and also perhaps puddle or run off the substrate.

Figure 5:
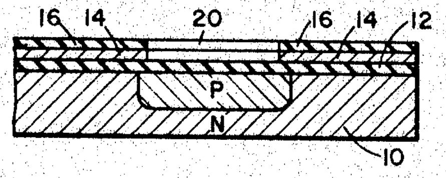
FIG. 5 shows the semiconductor wafer following the diffusion treatment.

Then, in accordance with FIG. 5 in the illustrated embodiment of the process, an opening is formed through the oxide layer 16 and through the metal layer 14. This opening can be formed by any usual photo-lithographic process, for example, a photo-resist, namely, a light sensitive masking material, is initially applied over the layer 16. The photo resist is selected to be resistant to the action of hydrofluoric acid, for example. The resist is selectively exposed to light in all areas, except for a central area 20. This exposure may be accomplished, for example, by directing an ultraviolet light onto the resist through a master pattern of desired configuration.

In the area of the resist exposed to light, the resist material becomes strongly adherent to the oxide layer 16, while the central portion of the photo-resist, corresponding to the area 20 which has not been exposed to light, may be readily washed away from the oxide layer 16 in a usual developing and washing operation.

Following the exposure to light and washing away of the unexposed photo-resist, an opening corresponding to the area 20, is formed through the oxide layer 16 and through the metal layer 14. It is usually preferable not to etch all the way down to the bare substrate 10. This is because there is often a tendency for the metal layer 14 to alloy with the substrate, when such etching is carried out. Instead, the etching process can be controlled so that the opening extends down to the lower silicon dioxide layer 12, but not through that layer. The lower layer acts as a protective coating for the surface of the substrate 10, and protects it not only from the alloying tendencies of the metal layer 14, but from the atmosphere itself.

The dopant material may be diffused through the layer 12, since that layer has no masking effect to certain types of dopants, such as the P type dopants referred to above.

The diffusion process is well known. A typical diffusion process for silicon may comprise a pre-deposition step, followed by a diffusion step in which the assembly is placed in a diffusion furnace, and the desired P type dopant is permitted to diffuse down into the wafer 10. In the pre-deposition step, the unit is usually placed in a reactor and heated to a temperature, for example, of the order of 1080° C. for one hour in a vapor of the selected impurity dopant. This causes a thin region of P type characteristics to be formed in the wafer 10 adjacent the opening corresponding to the area 20.

The unit may then be placed in a diffusion furnace for from twenty to forty hours in oxygen at 1250° C. This provides a P type region within the wafer, as shown in FIG. 5. This region is separated from the N region of the wafer by a PN junction. It will be observed that the junction extends to the front surface of the wafer, but is covered and passivated by the oxide layer 12 on that surface. Similar diffusion processes at lower temperatures can be carried out with germanium.

Figure 6:
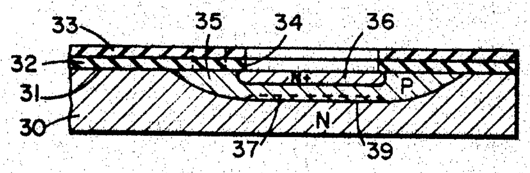
FIG. 6 is an enlarged cross sectional view of a semiconductor wafer using the teachings of the present invention with a silicon nitride mask and illustrating the lateral diffusion effects of a thick silicon dioxide lateral diffusing layer.

Referring next to FIG. 6 the lateral diffusion aspects of the present invention will be described. Silicon substrate 30 has a silicon dioxide layer 32 of at least about 500 angstrom units thick to effect a laterally extending diffusion along surface 31 of the substrate. When silicon dioxide layer 32 had a thickness of about 100 angstrom units, no lateral diffusion was noticed. The thickness of layer 32 at 500 angstrom units or greater is determinative of the lateral diffusion extent, the thicker the silicon dioxide layer, the greater the lateral diffusion extent. Such action is caused by the silicon dioxide layer being more permeable to indium and gallium dopants than is the silicon substrate or wafer.

Mask 33 consists of a thin layer of silicon nitride (200 A. for example). (The metals titanium and nickel may also be used.) A single aperture 34 is formed through layers 32 and 33 in a usual manner to expose surface 31 for two selective diffusions as described herein.

Generally, there are two methods of forming the laterally diffused base region 35 and the ultra-thin emitter region 36. The first method includes first diffusing laterally extending base region 35 and then through the same aperture 34 diffusing emitter region 36. The second method comprises first diffusing emitter region 36 through aperture 34 and then subsequently diffusing laterally extending base region 35. In the second method the depth of penetration of base region 35 is more shallow immediately under emitter region 36, such as indicated by dotted line 37, because of the lower diffusing rate of indium and gallium, for example, through a heavily doped region than through lightly doped silicon substrate 30.

In the first method the indium or gallium dopant, preferably in the gas phase, no limitation thereto intended, passes through aperture 34 into substrate 30 and simultaneously laterally through laterally diffusing layer 32. The lateral penetration is more rapid than through wafer 30 causing the lateral extent of region 35 to be substantially greater than the depth of penetration thereof. A diffusion of this type is characterized in that layer 32 receives and passes the gallium or indium doping impurities immediately above base region 35, but still retains its junction passivating characteristics.

When substrate 30 is of N type material, the diffused region 35 forms a rectifying junction therewith indicated by line 39. When substrate 30 is of P type, diffused laterally extending region 35 forms a broad low resistivity contact area for the substrate available from surface 31. Such lateral extent may be 10 or more times the depth of penetration of region 35 into substrate 30. When the diffusion of region 35 is performed in an non-oxidizing atmosphere, no oxide layer forms over surface 31 during the diffusion process. This type of diffusion eliminates the need for a wash-out type of etch before making the subsequent emitter 36 diffusion.

Subsequent to the region 35 diffusion, emitter 36 is diffused as in a non-oxidizing type of diffusion using arsenic or phosphorus, for example, as the impurity dopants. Emitter 36 diffuses under layer 32 a distance substantially equal to the depth of penetration. For example, if the depth of penetration is 0.1 micron the region 36 extends under layer 32 almost 0.1 micron. When emitter region 36 is formed in a non-oxidizing manner, no oxide layer will form on surface 31. This non-oxidizing diffusion is important because of the very small extent that the region extends under layer 32. Even a short buffer or wash-out etch will act on the silicon dioxide of layer 32 for causing it to recede past the surface 31 junction termination of junction 39. Such removal of layer 32 adversely affects the characteristics of such junction. When a non-oxidizing diffusion is used an electrical contact (not shown) may be fixed to surface 31 directly over emitter region 36.

Non-oxidizing type of diffusions are known. For example, one type of known non-oxidizing diffusion includes the deposition in a vacuum from an elemental source at usual diffusion temperatures.

In the non-oxidizing diffusion formation of region 35 a gaseous gallium diffusion may be used. In such a gaseous diffusion gallium oxide ($Ga_2O_3$) is supplied in a reducing atmosphere, such as hydrogen to form water vapor and gallium at known diffusion temperatures. The gallium is released to diffuse into the semiconductor material. Other gaseous diffusion processes may be used which include an inert atmosphere, such as nitrogen.

From an inspection of FIG. 6 it is seen that base region 35 extends laterally outwardly from emitter region 36 permitting an aperture to be cut through layers 32 and 33 as between dotted lines 38 for making a base electrode connection (not shown) to region 35 at surface 31. It should be noted that both regions 35 and 36 are formed through the single aperture 34, yet because of the lateral diffusing characteristics of this invention the lateral extent of base region 35 is much greater than emitter region 36 to facilitate making electrical connections thereto. Further, the volume of base region 35 is kept quite small for providing favorable high frequency characteristics in the resultant semiconductor structure. Forming both regions through the same aperture removes practically all registration problems inherently found in prior art processing of small area high frequency semiconductor structures.

It is permissible to form base or intermediate semiconductor region 35 in an oxidizing atmosphere. The resulting thin oxide layer (not shown) formed over surface 31 as a result of such diffusion may be removed by a buffer or a wash-out etch. Layer 32 along aperture 34 walls will recede somewhat due to etch cutting. However, when forming an emitter region 36 subsequent to such etch operation it diffuses under the layer 32 substantially the same distance as if the wall of aperture 34 had not receded. In the subsequent diffusing of region 36, it is preferred that such diffusion be performed in a non-oxidizing atmosphere, as heretofore discussed.

The second method of forming the FIG. 6 device includes the non-oxidizing diffusion of emitter 36 first as above described. Subsequently, through the same aperture 34 intermediate or base region 35 is then diffused. The indium or gallium dopants permeate lateral diffusing layer 32, as above described, to form the laterally diffused region 35. However, the impurity dopants when passing through heavily doped emitter region 36 are slowed compared to the rate of diffusion through a lighter doped substrate 30 causing the junction indicated by line 39 to be more shallow as indicated by dotted line 37 than with the region formed according to the first described method of FIG. 6. The resultant reduced depth or thickness of base region 35 immediately adjacent emitter region 36 provides more favorable high frequency characteristics over that provided by a device constructed according to the first described method. It should be noted that the total volume of base region 35 is kept smaller.

In fabricating a laterally diffused base region bounded by line 39 using a gallium diffusion through a silicon dioxide layer having a thickness of about 10,000 angstrom units, a lateral spread was 20 microns with a maximum depth of penetration of 0.9 micron was obtained. At a diffusion temperature of 1000° C. the effective diffusion coefficient of the silicon dioxide layer was about four orders of magnitude greater than the diffisivity in silicon of gallium and silicon. The angle formed between line 39 and layer 32 was approximately 30°. Such an angle of the base region with respect to the surface tends to increase the surface breakdown voltage of any rectifying junction formed along line 39.

A particular advantage of the invention is that it provides a convenient process for forming P type regions in an N type substrate for a planar passivated type of solid state semiconductor device. In addition a controlled lateral extent of the diffusion is provided by controlling the thickness of silicon dioxide layer 12.

I claim:

1. A process for the fabrication of diffused junction semiconductor devices which include the steps of:
(a) providing a semiconductor substrate,
(b) forming a protective layer of vapor plated glass material on a surface of said semiconductor substrate,
(c) forming a metallic mask having an opening therein on a surface of said vapor plated glass material, and
(d) selectively diffusing an impurity dopant into said substrate through said opening.

2. A process for the fabrication of diffused junction semiconductor devices which includes the steps of:
(a) providing a semiconductor substrate,
(b) forming a protective oxide layer on a surface of said semiconductor substrate,
(c) forming a metallic mask on a surface of said oxide layer having an opening therein, and
(d) selectively diffusing an impurity dopant into said substrate through said opening.

3. A process for fabrication of a diffused junction semiconductor device which includes the steps of:
(a) providing a semiconductor substrate of N type conductivity characteristics,
(b) forming a protective oxide layer on said surface oi said semiconductor substrate,
(c) forming a metallic mask on a surface of said semiconductor substrate having an opening therein, and
(d) selectively diffusing an impurity dopant of P type conductivity characteristics into said substrate through said opening.

4. A process for the fabrication of diffused junction semiconductor devices which includes the steps of:
(a) providing a semiconductor substrate,
(b) forming a protective oxide layer on said substrate,
(c) depositing a metallic masking film over said oxide layer,
(d) forming an opening in said metallic masking film, and
(e) diffusing an impurity dopant into said substrate through said opening.

5. A process for the fabrication of diffused junction semiconductor devices which includes the steps of:
(a) providing a semiconductor substrate,
(b) forming a first protective layer of vapor plated glass material on said substrate,
(c) depositing a metallic masking film on said first vapor plated glass material layer,
(d) forming a further protective vapor plated glass material layer over said metallic film,
(e) forming an opening in said further protective layer and in said metallic masking film, and
(f) diffusing and impurity dopant into said substrate through said opening and through said first protective vapor deposited glass material layer.

6. A process for the fabrication of diffused junction semiconductor devices which includes the steps of:
(a) providing a semiconductor substrate,
(b) forming a first protective oxide layer on said substrate,
(c) depositing a metallic masking film on said oxide layer,
(d) forming a further protective oxide layer over said metallic film,
(e) forming an opening in said further oxide layer and in said metallic masking film, and
(f) diffusing an impurity dopant into said substrate through said opening and through said first protective oxide layer.

7. A process for the fabrication of diffused junction semiconductor devices which includes the steps of:
(a) providing a semiconductor substrate of N type conductivity characteristics,
(b) forming a first protective oxide layer on said substrate,
(c) depositing a metallic masking film over said oxide layer,
(d) forming a further protective oxide layer over said metallic film,
(e) forming an opening in said further oxide layer and in said metallic oxide film, and
(f) diffusing an impurity dopant of P type conductivity characteristics into said substrate through said opening and through said first protective oxide layer.

8. The process of claim 6 in which said first and further oxide layers are composed of silicon dioxide, and in which said metallic layer is composed of nickel.

9. The process of claim 6 in which said first and further oxide layers are composed of silicon dioxide, and in which said metallic layer is composed of titanium.

10. The process of claim 6 wherein said protective oxide layer has a thickness not greater than about 100 angstrom units for inhibiting lateral diffusing therethrough.

11. A process for the fabrication of semiconductor structures, including in combination the steps of,
selecting a semiconductor substrate having a surface,
forming a lateral diffusing layer of material permeable to an impurity dopant on said surface of said substrate of a thickness of at least about 500 angstrom units,
forming a mask having an opening therein on a surface of said silicon dioxide layer impervious to said impurity dopant, and
selectively diffusing said impurity dopant through said opening into said substrate and laterally through said lateral diffusing layer and thence into said substrate along said layer for forming a laterally diffused region in said substrate.

12. The process of claim 11 wherein said mask is a metal selected from the class consisting of titanium, nickel and platinum.

13. The process of claim 11 wherein the lateral penetration of the gallium impurity dopant in said wafer is at least ten times the depth of penetration.

14. The process of claim 11 wherein mask consists of material selected from the class consisting of silicon nitride, boron nitride and silicon carbide.

15. The process of claim 11 wherein said mask is a silicon nitride layer.

16. The process of claim 11 wherein said opening extends to said surface and further including the steps of:

diffusing an N dopant into said structure through said opening in a non-oxidizing atmosphere to form an N doped region lying within the laterally diffused region which N dopant does not permeate said lateral diffusing layer, and completing the structure without etching the substrate surface at said mask opening.

17. The process of claim 16 wherein said non-oxidizing diffusion penetrates not more than about 0.1 micron into said substrate and under said lateral diffusing layer.

18. The process of claim 16 wherein both said diffusions are non-oxidizing.

19. The process of claim 18 wherein said N dopant diffusion is completed before starting said lateral diffusion of said impurity dopant.

20. The process of claim 11 wherein said layer has a thickness of at least 10,000 angstrom units.

21. The process of claim 11 wherein said layer consists of a silicon glass.

22. The process of claim 11 wherein said layer initially consists of pure silicon dioxide.

23. The process of claim 11 wherein said substrate is doped silicon.

24. The process of claim 23 wherein material forming said lateral diffusing layer diffuses said gallium impurity dopant at a rate at least about four times as fast as said impurity dopant diffuses through said substrate.

References Cited

UNITED STATES PATENTS

| | | | |
|---|---|---|---|
| 3,088,435 | 5/1963 | Wolff | 148—179 X |
| 3,144,366 | 8/1964 | Rideout. | |
| 3,165,430 | 1/1965 | Hugle | 148—187 |
| 3,193,418 | 7/1965 | Cooper | 148—187 |
| 3,245,794 | 4/1966 | Conley | 148—187 X |
| 3,275,910 | 9/1966 | Phillips. | |
| 3,298,879 | 1/1967 | Scott | 148—187 |

HYLAND BIZOT, Primary Examiner